(12) United States Patent
Inoue

(10) Patent No.: US 6,922,425 B2
(45) Date of Patent: Jul. 26, 2005

(54) SEMICONDUCTOR LASER DEVICE AND OPTICAL PICKUP DEVICE

(75) Inventor: Tetsuyoshi Inoue, Yamatotakada (JP)

(73) Assignee: Sharp Kabushiki Kaisha, Osaka (JP)

( * ) Notice: Subject to any disclaimer, the term of this patent is extended or adjusted under 35 U.S.C. 154(b) by 112 days.

(21) Appl. No.: 10/438,044

(22) Filed: May 15, 2003

(65) Prior Publication Data

US 2003/0214988 A1 Nov. 20, 2003

(30) Foreign Application Priority Data

May 17, 2002 (JP) ........................................ 2002-142741

(51) Int. Cl.$^7$ .............................. H01S 5/00; H01S 3/04
(52) U.S. Cl. ......................................... 372/43; 372/36
(58) Field of Search ................................ 372/36, 43–50

(56) References Cited

U.S. PATENT DOCUMENTS

| | | | |
|---|---|---|---|
| 4,488,304 A | * 12/1984 | Shimizu et al. | ............... 372/36 |
| 4,733,067 A | * 3/1988 | Oinoue et al. | .............. 250/216 |
| 5,345,336 A | * 9/1994 | Aoyama et al. | ............ 359/628 |
| 5,519,720 A | * 5/1996 | Hirano et al. | .................. 372/36 |
| 5,898,167 A | * 4/1999 | Musha et al. | ............ 250/201.5 |
| 6,678,298 B2 | * 1/2004 | Ariyoshi | ....................... 372/43 |
| 2004/0228378 A1 | * 11/2004 | Inoue | .......................... 372/36 |

FOREIGN PATENT DOCUMENTS

| | | | |
|---|---|---|---|
| JP | 57049287 A | * 3/1982 | ............. H01S/3/18 |
| JP | 2000-260053 | 9/2000 | |
| JP | 2000-353335 | 12/2000 | |
| JP | 3216396 B2 | 8/2001 | |
| JP | 3281805 B2 | 2/2002 | |

* cited by examiner

Primary Examiner—Minsun Oh Harvey
Assistant Examiner—Phillip Nguyen
(74) Attorney, Agent, or Firm—Morrison & Foerster LLP

(57) ABSTRACT

In a semiconductor laser device, a plane of polarization of a laser beam emitted by a semiconductor laser (4) is inclined from a substrate surface (4A), allowing the semiconductor laser (4) to be higher in power and higher in reliability. Moreover, a die-bond surface (17) of this semiconductor laser (4) is inclined by a specified inclination angle θ with respect to the reference surface (3) of the stem body (1), so that the plane of polarization of the laser beam can be made generally parallel to the reference surface (3) of the stem body (1). Thus, there can be provided a semiconductor laser device which is capable of contributing to a thinning of an optical pickup device and easy to manufacture.

6 Claims, 5 Drawing Sheets

SEMICONDUCTOR LASER DEVICE AND OPTICAL PICKUP DEVICE

BACKGROUND OF THE INVENTION

The present invention relates to a semiconductor laser device and an optical pickup device for makeup of, for example, optical disk systems and, more particularly, relates to a semiconductor laser device equipped with a semiconductor laser in which the plane of polarization of an outputted laser beam is inclined with respect to the substrate.

FIG. 5 shows a conventional semiconductor laser device 100 as viewed downward along a direction vertical to the drawing sheet that is the outgoing direction of the laser beam. The semiconductor laser device 100 shown in FIG. 5 is in a state with the cap removed for explanation's sake.

In this semiconductor laser device 100, a semiconductor laser 104 is die bonded to a side face 102A of a heat radiation base 102 protruding upward from a metallic stem body 101. The side face 102A, on which the semiconductor laser 104 is mounted, is referred to as die bond surface. In FIG. 5, reference numeral 105 denotes a photodetection device 105 for monitoring of the power of the semiconductor laser 104, 107 denotes a metallic wire 107, and 108 denotes a lead pin fixed to the stem body 101 via a dielectric. Also, numeral 106 denotes a photodetection device for use of signal detection, having a plurality of photo-detecting portions and signal processing circuits integrated therein.

This signal-detection use photodetection device 106 detects a signal beam reflected by an optical disk to read a signal from the optical disk or detect a focal error signal or track error signal.

The die bond surface 102A is, normally, set parallel to a reference plane 103 which is part of an outer peripheral surface 101A of the stem body 101. The outer peripheral surface 101A is composed of a parallel surface 111 opposite to the reference plane 103, and circular-arc surfaces 112, 113 which connect the reference plane 103 and the parallel surface 111 to each other.

Normally, these circular-arc surfaces 112, 113 have their centers placed at the emission point of the semiconductor laser 104. According to this placement, rotating the semiconductor laser device 100 about the emission point along cylindrical surfaces which are extension surfaces of the circular-arc surfaces 112, 113 of the stem body 101 makes it possible to adjust any inclination of an outgoing laser beam extending from the emission point about the optical axis without moving the emission point of the semiconductor laser 104.

Next, FIG. 6 shows the structure of an optical pickup device 200 equipped with the semiconductor laser device 100. This optical pickup device 200 is made up of the semiconductor laser device 100, a prism 203, a photodetector 204 for monitoring of laser power, a collimator lens 202, a raising mirror 214, and an objective lens 305. In FIG. 6, a one-dot chain line J represents the optical axis of a laser beam emitted from the semiconductor laser 104 of the semiconductor laser device 100.

The laser beam emitted from the semiconductor laser 104 is outputted in parallel to the reference plane (not shown) of the optical pickup device 200. This laser beam is partly branched by the branching use prism 203, coming incident on the laser-power monitoring photodetector 204.

In this semiconductor laser device 100, as shown in FIG. 5, a laser beam emitted from the rear face of the semiconductor laser 104 is received by the photodetection device 105, by which the laser power is monitored. Otherwise, as shown in FIG. 6, a laser beam emitted from the front face of the semiconductor laser 104 may also be monitored by the photodetector 204. This photodetector 204 is used in cases, for example, where the semiconductor laser 104 is a high-power laser with a small output from the rear face of the semiconductor laser 104 or where a high-density optical disk system to which high monitor precision is required is built up.

The laser beam transmitted by the branching prism 203 is collimated by the collimator lens 202 into parallel light, thereafter turned in direction by the raising mirror 214, and condensed to an information recording surface of an optical disk 306, which is an optical information recording medium, by the objective lens 305. The signal light reflected by the optical disk 306 travels along the original route indicated by the one-dot chain line, and is partly branched by a hologram device (not shown) integrated with the semiconductor laser device 100, and comes incident on the signal-detection use photodetection device 106. Thus, the signal from the optical disk 306 is read.

The reference plane 103 of the semiconductor laser device 100 is a reference plane for determining the position of the semiconductor laser device 100 with respect to the reference plane (not shown) of the optical pickup device 200. Normally, this reference plane 103 is positioned so as to be parallel to the mounting surface, and slightly rotated and adjusted around the optical axis J of the laser beam.

Accordingly, the thickness D of the semiconductor laser device 100 is determined by a distance from the reference plane 103 to the semiconductor laser 104, and reducing the thickness D causes the semiconductor laser device 100 to be thinned, allowing the optical pickup device 200 to be also thinned. Further, the smaller the distance between the optical disk 306 and the reference plane of the optical pickup device 200 is, the thinner the optical disk system can be made.

Also, as illustrated in FIG. 3, the laser beam of the semiconductor laser 104 expands as it travels along the optical axis J, where the expansion is formed into an increasingly widening conical shape with the optical axis J serving as a central axis. This increasingly widening conical shape has an elliptical-shaped outer circumference. The major axis of this ellipse is vertical (or parallel) to a substrate surface 104A of the semiconductor laser 104. The minor axis of the ellipse is parallel (or vertical) to the substrate surface 104A. Also, the substrate surface 104A is parallel to the die bond surface 102A and the reference plane 103.

Meanwhile, conventionally, in the semiconductor laser 104, the direction of polarization of a laser beam would be the same as the direction of expansion of the laser beam. Therefore, it has been the case that considerations are given not to the direction of polarization of the laser beam, but to the direction of expansion of the laser beam alone. That is, it has conventionally been practiced that the direction of the major axis in the expanding ellipse of the laser beam is set vertical (or parallel) to the reference plane 103 of the stem body 101.

For example, in one concrete example shown in FIG. 3, the major axis of the expanding ellipse of the laser beam is a Y axis vertical to the reference plane 103 and its minor axis is an X axis parallel to the reference plane 103. Also in this one example, the direction of polarization of the laser beam is along the X axis, while the direction of polarization is along the Y axis.

In contrast to this, it is a recent trend that a semiconductor laser in which the direction of expansion or direction of polarization of the laser beam is inclined from the horizontal or vertical direction with respect to the substrate surface of the semiconductor laser is employed with a view to improving the semiconductor laser characteristics (e.g., for higher power).

For instance, when a semiconductor laser in which the direction of polarization is inclined by a specified angle θ from the substrate surface is die bonded to a die bond surface 102A of the conventional stem body 101, the direction of the minor axis in the intensity distribution and the direction of polarization of an output laser beam would be inclined by the specified angle θ from the X-axis direction parallel to the substrate surface.

In the case where such a semiconductor laser device is used as a light source for a conventional optical pickup device, the branching ratio of the branching prism 203 or the branching ratio of the hologram device would deviate from design values, posing an issue that specified characteristics could no longer be obtained. The reason why the specified characteristics could no longer be obtained is due to the fact that reflection characteristics and transmission characteristics of a dielectric multilayer film that makes the optical branching prism 203 has a polarization dependency. Also, in holograms or other like optical devices in which grooves are arrayed in a fixed direction, their optical branch characteristics would change depending on the relationship between the direction of grooves and the direction of polarization.

In the semiconductor laser device 100 shown in FIG. 5, the outer peripheral surface 101A of its stem body 101 is formed into a shape that a circle including circular-arc surfaces 112, 113 is cut by a chord making the reference plane 103, so that the distance from the reference plane 103 to the optical axis J is reduced, thus achieving the thinning of the device.

In contrast to this, in the case where the semiconductor laser device 100 has a semiconductor laser whose direction of polarization is inclined by a specified angle θ from the substrate surface, the semiconductor laser device 100 is rotated about the optical axis J with respect to the optical pickup device 200 by a specified angle (−θ) inverse to the specified angle θ so that the direction of polarization of a laser beam of the semiconductor laser is parallelized to the reference plane of the optical pickup device 200.

With the placement that the semiconductor laser device 100 is rotated relative to the optical pickup device 200 as shown above, the optical axis J and the reference plane 103 of the semiconductor laser device 100 are inclined with respect to the reference plane of the optical pickup device 200, which would cause an obstacle to the thinning of the optical pickup device, as an issue.

SUMMARY OF THE INVENTION

Accordingly, an object of the present invention is to provide a semiconductor laser device including a semiconductor laser device in which the direction of polarization is inclined with respect to the substrate surface and which is improved in characteristics so that the semiconductor laser device can contribute to enhancement toward higher power, higher reliability and thinner size, as well as to provide the optical pickup device.

In order to achieve the above object, a semiconductor laser device comprising:

a base having an anchor surface and a reference surface; and a semiconductor laser, wherein the semiconductor laser is fixed to the anchor surface of the base, and the anchor surface is inclined by a specified inclination angle with respect to the reference surface of the base, and a plane of polarization of a laser beam emitted by the semiconductor laser is inclined by the specified inclination angle from a substrate surface of the semiconductor laser so as to be generally parallel to the reference surface of the base, or the plane of polarization of the laser beam is inclined by the specified inclination angle with respect to a plane vertical to the substrate surface so as to be generally vertical to the reference surface of the base.

In the semiconductor laser device of this invention, by virtue of the arrangement that the plane of polarization of the semiconductor laser is inclined from the substrate surface or a plane vertical to the substrate surface, the semiconductor laser can be made higher in power and higher in reliability. Moreover, by the arrangement that the anchor surface of this semiconductor laser is inclined by a specified inclination angle with respect to the reference surface of the base, the plane of polarization of the laser beam can be made generally parallel or generally vertical to the reference surface of the base.

Thus, in the semiconductor laser device of this invention, the reference surface represents a plane of polarization of the semiconductor laser or a plane vertical to the plane of polarization, so that the semiconductor laser device can more easily be placed and assembled to an optical pickup device having an optical device having a polarization dependency. Besides, according to the semiconductor laser device of this invention, there is no need for oblique placement to the optical device of the optical pickup device, which contributes to a thinning or size reduction of the optical pickup device.

In one embodiment of the present invention, the base includes a stem body having the reference surface, and a generally L-shaped anchor portion fixed to the stem body and having the anchor surface, the anchor portion includes an X-direction portion extending generally parallel to the reference surface, and a Y-direction portion extending generally vertical to the reference surface and having a signal-detection use photodetection device mounted on its upper surface, and the X-direction portion has a reference-surface-side side face extending generally parallel to the reference surface and an opposite-side side face containing the anchor surface, the opposite-side side face being opposite to the reference-surface-side side face, where an obtuse angle is formed between the side face containing the anchor surface and a side face of the Y-direction portion adjacent to the side face.

With this constitution, in the manufacturing process of the semiconductor laser device, when the semiconductor laser chip is mounted on the anchor surface by using a holding jig such as a collet, the holding jig does not make contact with the Y-direction portion having the photodetection device mounted thereon. Thus, the semiconductor laser device becomes easier to manufacture.

In one embodiment of the present invention, the semiconductor laser device further comprises:

a first semiconductor laser implemented by the above-defined semiconductor laser, the base having a first anchor surface implemented by the above-defined anchor surface, and a second anchor surface adjacent to the first anchor surface and generally parallel to the reference surface; and a second semiconductor laser fixed to the second anchor surface and having a plane of polarization of a laser beam generally parallel or generally vertical to the reference surface.

In this embodiment, the semiconductor laser device includes a plurality of semiconductor lasers including the first semiconductor laser the plane of polarization of which is inclined from the substrate surface or a plane vertical to the substrate surface, and the plurality of semiconductor lasers have a plane of polarization generally parallel or generally vertical to the reference surface of the base. Therefore, according to this semiconductor laser device, assembly to an optical pickup device can easily be achieved, and a thinning or size reduction of the optical pickup device becomes implementable, and moreover, even higher power is achievable.

In one embodiment of the present invention, the base includes a stem body having the reference surface, and a generally L-shaped anchor portion fixed to the stem body and having the first and second anchor surfaces, the anchor portion includes an X-direction portion extending generally parallel to the reference surface, and a Y-direction portion extending generally vertical to the reference surface and having a signal-detection use photodetection device mounted on its upper surface, and the X-direction portion has a reference-surface-side side face extending generally parallel to the reference surface and an opposite-side side face containing the first and second anchor surfaces, the opposite-side side face being opposite to the reference-surface-side side face, where the second anchor surface is closer to the Y-direction portion than the first anchor surface, and where an obtuse angle is formed between a side face of the Y-direction portion extending generally vertical to the reference surface and adjacent to a side face containing the first and second anchor surfaces, and a plane containing the first anchor surface.

Further, an optical pickup device of this invention includes the above-defined semiconductor laser device.

In this optical pickup device, by virtue of the inclusion of a semiconductor laser device which is capable of contributing to enhancement toward higher power and a thinner, smaller formation of the optical pickup device and which is easy to assemble, it becomes a reality to implement higher-speed write and read operations.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the present invention is described in detail by way of embodiments thereof illustrated in the accompanying drawings.

(First Embodiment)

Figure 1:
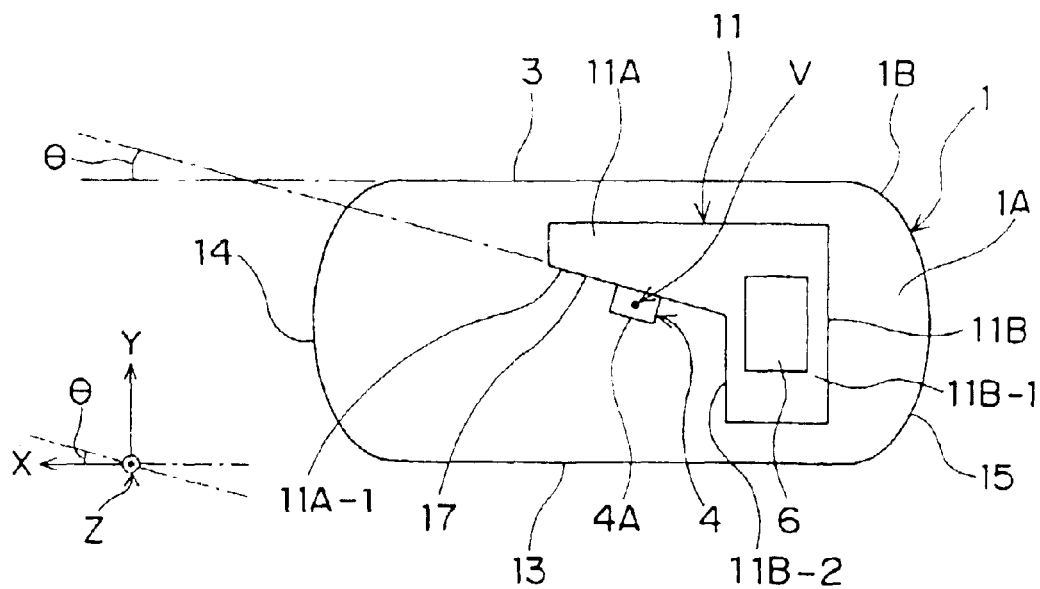
FIG. 1 is a plan view showing a first embodiment of the semiconductor laser device of the present invention.

FIG. 1 shows a first embodiment of the semiconductor laser device of the present invention. This first embodiment is a semiconductor laser device equipped with one semiconductor laser 4.

This first embodiment includes a stem body 1, an anchor portion 11 serving as a heat radiation base fixed to an upper surface 1A of the stem body 1, a semiconductor laser 4 fixed to the anchor portion 11, and a photodetection device 6 for use of signal detection. The stem body 1 and the anchor portion 11 constitute a base.

The stem body 1 has an outer peripheral surface 1B composed of a flat reference surface 3, an opposing surface 13, and circular-arc surfaces 14, 15. The opposing surface 13 is opposed in parallel to the reference surface 3, and the circular-arc surfaces 14, 15 form part of one circle.

The anchor portion 11, which is formed into a generally inverted-L shape, is composed of an X-direction portion 11A extending generally parallel to the reference surface 3, and a Y-direction portion 11B extending generally vertical to the reference surface 3. On an upper surface 11B-1 of the Y-direction portion 11B, is fixed the signal-detection use photodetection device 6, the photo-detecting surface (not shown) of which is directed to a direction toward which the upper surface 11B-1 is directed, i.e., to a Z-direction vertical to the drawing sheet.

The semiconductor laser 4 is die-bonded to a die-bond surface 17 which is a anchor surface forming a side face 11A-1 of the X-direction portion 11A of the anchor portion 11. This die-bond surface 17 is inclined by a specified angle θ with respect to the reference surface 3 of the stem body 1 so as to form an obtuse angle against the Y-direction portion 11B. As shown in FIG. 1, in the X-Y-Z orthogonal coordinate system, it is assumed that the reference surface 3 is an X-Z plane vertical to the Y axis, and that the upper surface 1A of the stem body 1 is an X-Y plane. Then, the die-bond surface 17 is inclined by the angle θ (for example, 15°) clockwise with respect to the reference surface 3 around the Z axis vertical to the X-Y plane. Therefore, a substrate surface 4A of the semiconductor laser 4 is inclined by the angle θ clockwise with respect to the reference surface 3 around the Z axis vertical to the X-Y plane.

Also, the semiconductor laser 4 is fixed to the die-bond surface 17 so that an emission point V of the semiconductor laser 4 is positioned at a center of one circle containing the circular-arc surfaces 14, 15. Further, a laser beam emitted by the semiconductor laser 4 has an optical axis J which is an axis extending from the emission point V along the Z axis, and a plane of polarization of this laser beam is inclined by the angle θ counterclockwise around the optical axis J from the substrate surface 4A of the semiconductor laser 4. As a result, the plane of polarization of the laser beam is parallel to the reference surface 3.

Consequently, according to the semiconductor laser device of this embodiment, by virtue of the arrangement that the plane of polarization of the laser beam of the semiconductor laser 4 is inclined by the specified angle θ with respect to the substrate surface 4A, power of the laser beam can be improved as compared with the case where the semiconductor laser device includes a semiconductor laser having a plane of polarization parallel to the substrate surface. Besides, with the die-bond surface 17 inclined by the specified angle with respect to the reference surface 3, the plane of polarization of the laser beam is set parallel to the reference surface 3. As a result, this semiconductor laser device may be incorporated into an optical pickup device with the reference surface 3 set coincident with a reference plane of the optical pickup device, as in the case of the semiconductor laser device having a semiconductor laser having a plane of polarization parallel to the substrate surface.

Thus, according to this embodiment, there can be provided a semiconductor laser device capable of improving the power of the emitted laser beam without impairing the thinness of the optical pickup device.

(Second Embodiment)

Figure 2:
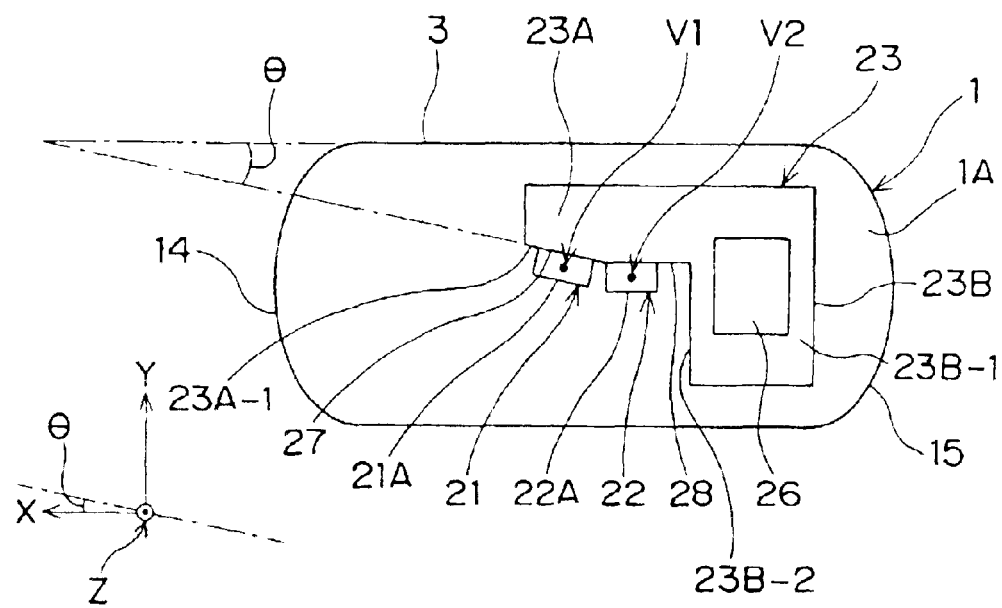
FIG. 2 is a plan view showing a second embodiment of the semiconductor laser device of the invention.
Figure 3:
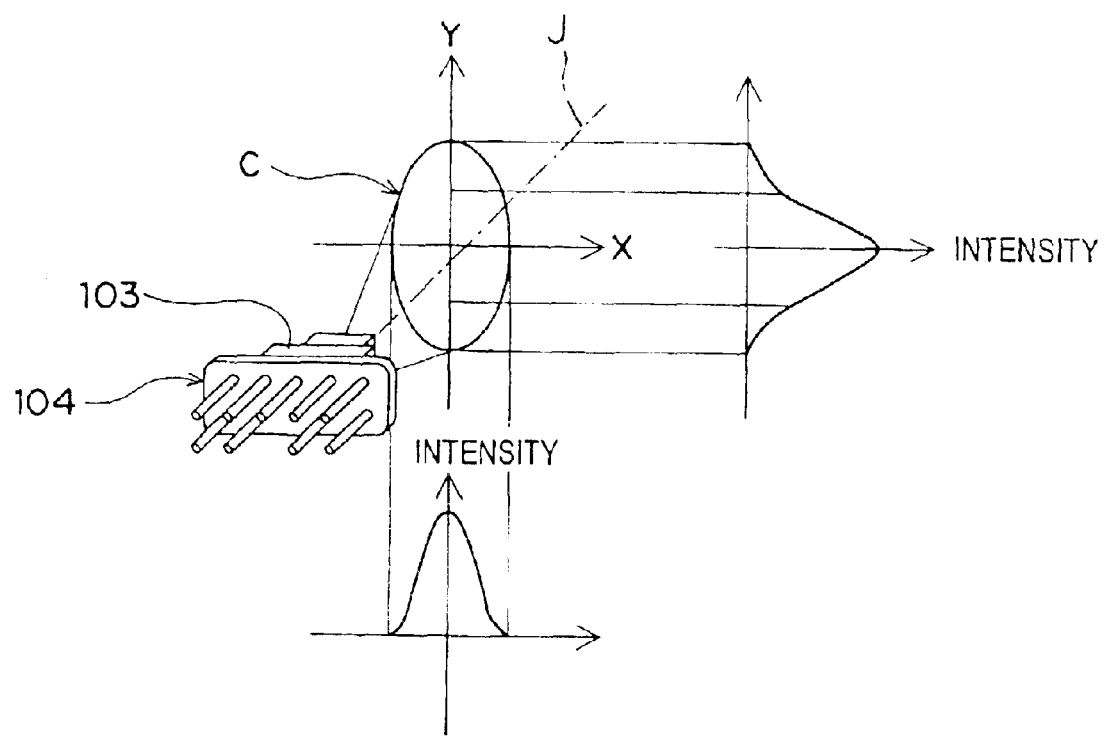
FIG. 3 is a schematic view for explaining the laser intensity distribution of the semiconductor laser device.

Next, FIG. 2 shows a second embodiment of the semiconductor laser device of the invention. This second embodiment has two semiconductor lasers 21, 22. This second embodiment includes the same stem body 1 as in the foregoing first embodiment.

This second embodiment includes an anchor portion 23 serving as a heat radiation base fixed to an upper surface 1A of the stem body 1, two semiconductor lasers 21, 22 fixed to the anchor portion 23, and a photodetection device 26 for use of signal detection.

The stem body 1 is the same as the stem body 1 of the foregoing first embodiment and therefore indicated by the same reference numeral, with its description omitted. Also, the semiconductor laser 21 is a first semiconductor laser, the semiconductor laser 22 is a second semiconductor laser, and the stem body 1 and the anchor portion 23 constitute a base.

The anchor portion 23, which is generally inverted-L shaped, is composed of an X-direction portion 23A extending generally parallel to the reference surface 3, and a Y-direction portion 23B extending generally vertical to the reference surface 3. On an upper surface 23B-1 of the Y-direction portion 23B, is fixed the signal-detection use photodetection device 26, the photo-detecting surface of which is directed to a direction toward which the upper surface 23B-1 is directed, i.e., to a Z-direction vertical to the drawing sheet.

The first semiconductor laser 21 is fixed to a first die-bond surface 27 which is a first anchor surface out of die-bond surfaces 27, 28 forming a side face 23A-1 of the X-direction portion 23A of the anchor portion 23, and the second semiconductor laser 22 is fixed to the second die-bond surface 28 which is a second anchor surface.

The first die-bond surface 27 is positioned at a place in the X-direction portion 23A closer to one end thereof in the X direction parallel to the reference surface 3 than the second die-bond surface 28, and this first die-bond surface 27 is inclined by a specified angle $\theta$ with respect to the reference surface 3 of the stem body 1.

As shown in FIG. 2, the reference surface 3 is an X-Z plane vertical to the Y axis, and the upper surface 1A of the stem body 1 is an X-Y plane. Then, the first die-bond surface 27 is inclined by the angle $\theta$ (for example, 15°) clockwise with respect to the reference surface 3 around the Z axis vertical to the X-Y plane so that a plane including the first die-bond surface 27 forms an obtuse angle against a side face 23B-2 of the Y-direction portion 23B. Therefore, a substrate surface 21A of the semiconductor laser 21 is inclined by the angle $\theta$ clockwise with respect to the reference surface 3 around the Z axis vertical to the X-Y plane.

Also, in the first semiconductor laser 21, a laser beam emitted from its emission point V1 has an optical axis J1 which is an axis extending from the emission point V1 along the Z axis, and a plane of polarization of this laser beam is inclined by the angle $\theta$ counterclockwise around the optical axis J1 from the substrate surface 21A of the semiconductor laser 21. As a result, the plane of polarization of the laser beam is parallel to the reference surface 3.

On the other hand, the second semiconductor laser 22 is fixed to the die-bond surface 28 parallel to the reference surface 3, and a substrate surface 22A of this second semiconductor laser 22 is parallel to the reference surface 3. The second semiconductor laser 22 has an optical axis J2 which is an axis extending from an emission point V2 of the second semiconductor laser 22 along the Z axis, and a plane of polarization of a laser beam emitted by this second semiconductor laser 22 is directed to the X-direction parallel to the reference surface 3.

In this second embodiment, it is arranged that the center of a circle including the circular-arc surfaces 14, 15 of the stem body 1 is positioned at a generally center of a line segment interconnecting the emission point V1 of the first semiconductor laser 21 and the emission point V2 of the second semiconductor laser 22. Accordingly, the anchor portion 23 is fixed to the upper surface 1A of the stem body 1 in such a way that a point of contact between the die-bond surface 27 and the die-bond surface 28 is positioned generally at the center of the circle. As a result, positioning the first semiconductor laser 21 and the second semiconductor laser 22 close to each other with the point of contact interposed therebetween makes it possible to position a generally midpoint between the emission points V1 and V2 to the center of the circle. In this second embodiment, it has been set that the emission points V1, V2 of the semiconductor lasers 21, 22 are positioned close to the die-bond surfaces 27, 28 at a distance of, for example, about 5 $\mu$m. However, with the distance of closeness larger than that, it is also possible that the midpoint between the emission points V1 and V2 is positioned at the center of the circle by adjusting the fixation position of the anchor portion 23 on the upper surface 1A of the stem body 1 or the fixation positions of the semiconductor lasers 21, 22 on the die-bond surfaces 27, 28.

According to this second embodiment, by virtue of the arrangement that the plane of polarization of the laser beam of the semiconductor laser 21 is inclined by the specified angle $\theta$ with respect to the substrate surface 21A, power of the laser beam can be improved. Besides, with the die-bond surface 27 inclined by the specified angle with respect to the reference surface 3, the plane of polarization of the laser beam is set parallel to the reference surface 3. As a result, this semiconductor laser device may be incorporated into an optical pickup device with the reference surface 3 set coincident with a reference plane of the optical pickup device, as in the case of the semiconductor laser device having a semiconductor laser having a plane of polarization parallel to the substrate surface.

Thus, according to this second embodiment, there can be provided a semiconductor laser device capable of improving the power of the emitted laser beam without impairing the thinness of the optical pickup device.

(Third Embodiment)

Figure 4:
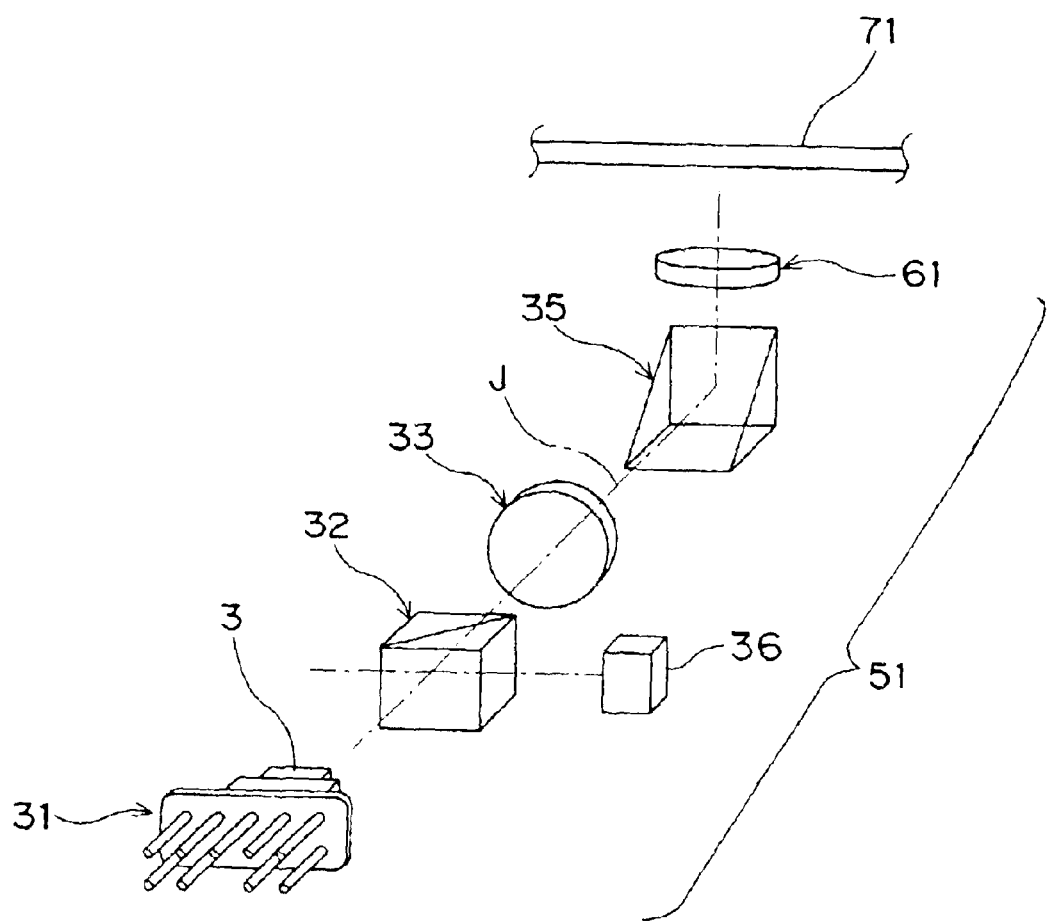
FIG. 4 is a schematic view showing an optical pickup device using the semiconductor laser device of the invention.
Figure 5:
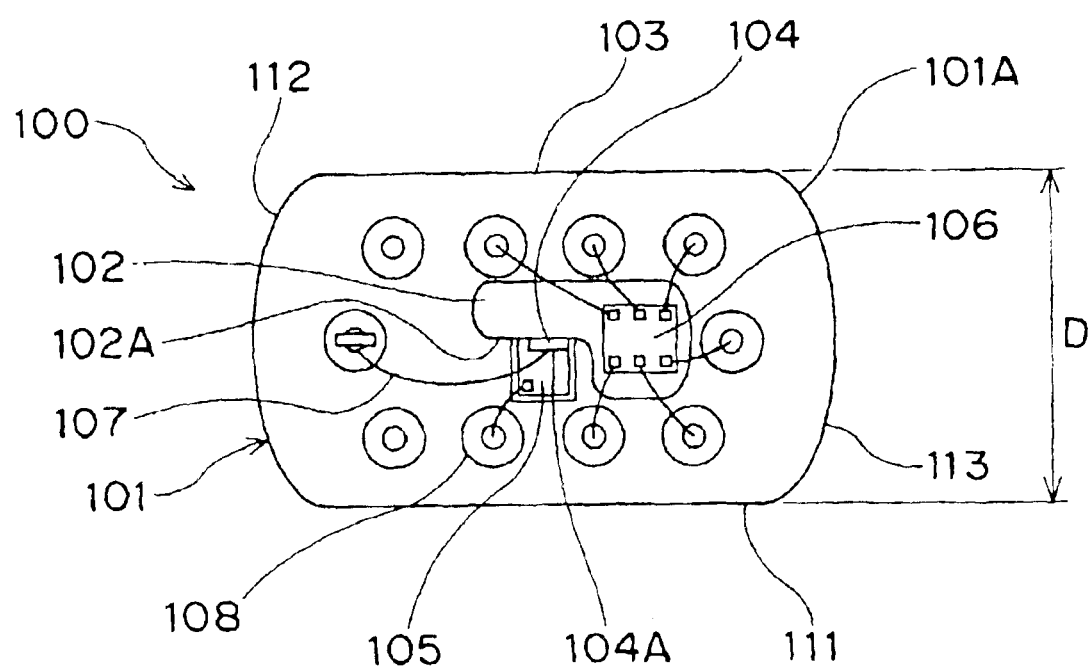
FIG. 5 is a plan view of a semiconductor laser device of the prior art.
Figure 6:
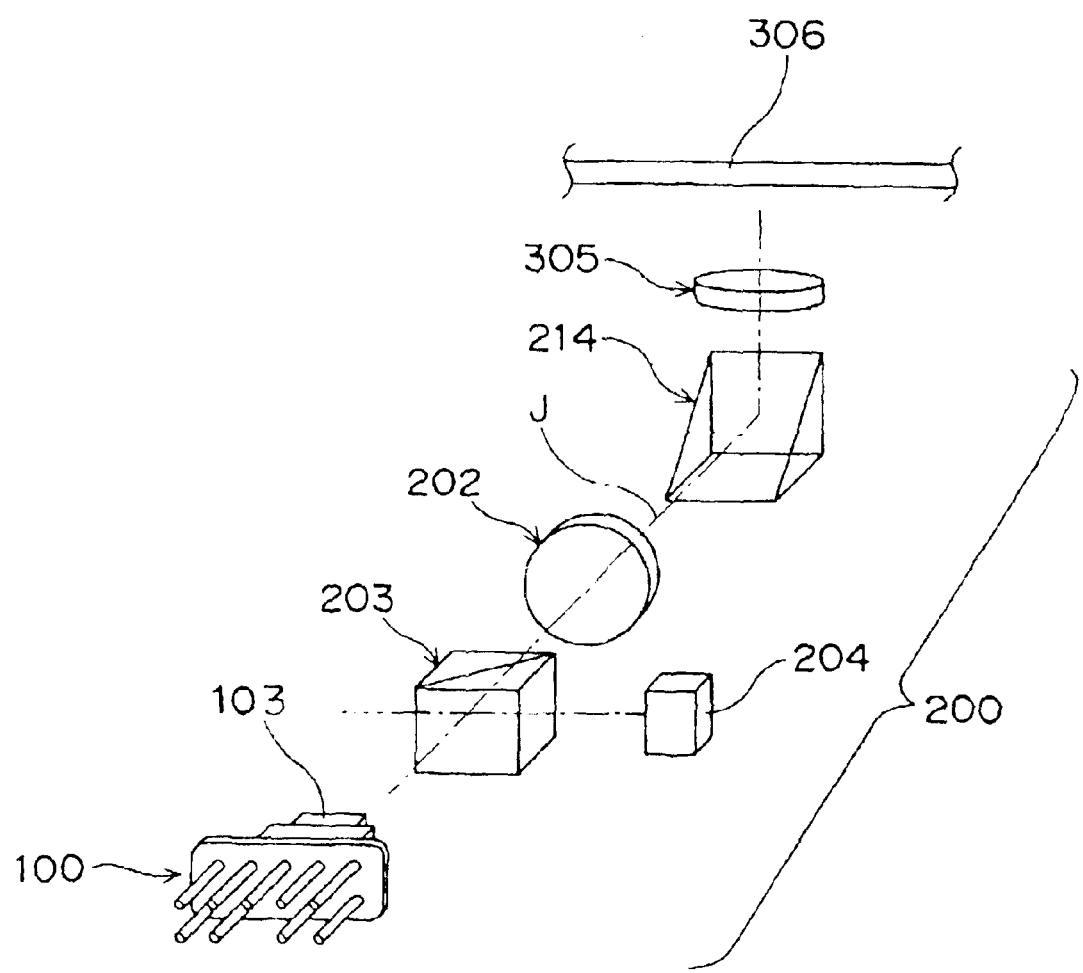
FIG. 6 is a schematic view showing an optical pickup device using the semiconductor laser device of the prior art.

Next, FIG. 4 shows, as a third embodiment, an optical pickup device 51 equipped with the semiconductor laser device 31 of the first embodiment. This optical pickup device 51 includes the semiconductor laser device 31, a branching prism 32, a collimator lens 33, a raising mirror 35 and an objective lens 61, where these branching prism 32, collimator lens 33 and raising mirror 35 are arranged in this order along the optical axis J of the laser beam of the semiconductor laser device 31. Also, the objective lens 61 is placed along an optical axis orthogonal to the optical axis J. Further, this optical pickup device has a laser-power monitoring use photodetection device 36 which receives a laser beam branched by the branching prism 32.

The objective lens 61 is placed above the raising mirror 35 of this optical pickup device 51, and a laser beam is applied to an optical disk 71 as an optical information recording medium through this objective lens 61.

According to the optical pickup device 51 of this third embodiment, by virtue of its including the semiconductor laser device 31 of the first embodiment, the semiconductor laser device 31 can be incorporated into the optical pickup device 51 with the reference surface 3 of the semiconductor laser device 31 set coincident with a reference plane of the optical pickup device 51.

Thus, according to the optical pickup device 51 of this third embodiment, there can be provided an optical pickup device improved in the power of the emitted laser beam while realizing a thinness comparable to that including a semiconductor laser device having a semiconductor laser having a plane of polarization parallel to the substrate surface.

Furthermore, in this third embodiment, in the case where a hologram by which signal light that has been emitted from the semiconductor laser 4, reflected by the optical disk 71 and returned to the semiconductor laser device is deflected toward the signal-detection use photodetection device 6 is attached to the base formed by the stem body 1 and the anchor portion 11, there can be provided an optical pickup device which is easier to assemble. Furthermore, in the first to third embodiments, it has been arranged that the plane of polarization of the laser beam of the semiconductor laser 4, 21 is inclined by the specified angle from the substrate surface 4A, 21A of the semiconductor laser 4, 21 so as to be generally parallel to the reference surface 3. However, it is also allowable that the plane of polarization of the laser beam of the semiconductor laser 4, 21 is inclined by a specified inclination angle with respect to a plane vertical to the substrate surface 4A, 21A so as to be generally vertical to the reference surface 3. In this case, the reference surface 3 may be a plane vertical to the plane of polarization. As a consequence of this, it becomes easier to assemble the semiconductor laser device to an optical pickup device having an optical device (for example, branching prism) having a polarization dependency, and moreover the need for oblique placement of the semiconductor laser device onto the optical device is eliminated, thus making it feasible to provide a thinner or smaller-size optical pickup device.

In the arrangement of FIG. 4, the semiconductor laser device according to the second embodiment shown in FIG. 2 may be installed instead of the semiconductor laser device 31 according to the first embodiment. In this case, there is a need for additionally providing a laser-power monitoring photodetector dedicated to the second semiconductor laser 22. However, techniques therefor are already known to those skilled in the art, and omitted in the drawings.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device comprising:
   a base having an anchor surface and a reference surface; and
   a semiconductor laser,
   wherein the semiconductor laser is fixed to the anchor surface of the base, and the anchor surface is inclined by a specified inclination angle with respect to the reference surface of the base,
   a plane of polarization of a laser beam emitted by the semiconductor laser is inclined by the specified inclination angle from a substrate surface of the semiconductor laser so as to be generally parallel to the reference surface of the base, or the plane of polarization of the laser beam is inclined by the specified inclination angle with respect to a plane vertical to the substrate surface so as to be generally vertical to the reference surface of the base,
   the base includes a stem body having the reference surface, and a generally L-shaped anchor portion fixed to the stem body and having the anchor surface,
   the anchor portion includes an X-direction portion extending generally parallel to the reference surface, and a Y-direction portion extending generally vertical to the reference surface and having a signal-detection use photodetection device mounted on its upper surface, and
   the X-direction portion has a reference-surface-side side face extending generally parallel to the reference surface and an opposite-side side face containing the anchor surface, the opposite-side side face being opposite to the reference-surface-side side face, where an obtuse angle is formed between the side face containing the anchor surface and a side face of the Y-direction portion adjacent to the side face.

2. A semiconductor laser device comprising:
   a base having an anchor surface and a reference surface;
   a semiconductor laser,
      wherein the semiconductor laser is fixed to the anchor surface of the base, and the anchor surface is inclined by a specified inclination angle with respect to the reference surface of the base, and
      a plane of polarization of a laser beam emitted by the semiconductor laser is inclined by the specified inclination angle from a substrate surface of the semiconductor laser so as to be generally parallel to the reference surface of the base, or the plane of polarization of the laser beam is inclined by the specified inclination angle with respect to a plane vertical to the substrate surface so as to be generally vertical to the reference surface of the base;
   a first semiconductor laser implemented by the above-defined semiconductor laser, the base having a first anchor surface implemented by the above-defined anchor surface, and a second anchor surface adjacent to the first anchor surface and generally parallel to the reference surface; and
   a second semiconductor laser fixed to the second anchor surface and having a plane of polarization of a laser beam generally parallel or generally vertical to the reference surface.

3. The semiconductor laser device according to claim 2, wherein:
   the base includes a stem body having the reference surface, and a generally L-shaped anchor portion fixed to the stem body and having the first and second anchor surfaces, the anchor portion includes an X-direction portion extending generally parallel to the reference surface, and a Y-direction portion extending generally vertical to the reference surface and having a signal-detection use photodetection device mounted on its upper surface, and the X-direction portion has a reference-surface-side side face extending generally parallel to the reference surface and an opposite-side side face containing the first and second anchor surfaces, the opposite-side side face being opposite to the reference-surface-side side face, where the second anchor surface is closer to the Y-direction portion than the first anchor surface, and where an obtuse angle is formed between a side face of the Y-direction portion extending generally vertical to the reference surface and adjacent to a side face containing the first and second anchor surfaces, and a plane containing the first anchor surface.

4. A semiconductor laser package comprising:

an optical pickup device; and a semiconductor laser device, wherein the semiconductor laser device is the semiconductor laser device of claim 1.

5. A semiconductor laser package comprising:

an optical pickup device; and a semiconductor laser device, wherein the semiconductor laser device is the semiconductor laser device of claim 2.

6. A semiconductor laser package comprising:

an optical pickup device; and a semiconductor laser device, wherein the semiconductor laser device is the semiconductor laser device of claim 3.

* * * * *